(12) United States Patent
Chu et al.

(10) Patent No.: US 10,680,019 B2
(45) Date of Patent: Jun. 9, 2020

(54) SELECTIVE POLYSILICON DOPING FOR GATE INDUCED DRAIN LEAKAGE IMPROVEMENT

(71) Applicant: Taiwan Semiconductor Manufacturing Co., Ltd., Hsin-Chu (TW)

(72) Inventors: Chen-Liang Chu, Hsin-Chu (TW);
Chih-Wen Albert Yao, Hsinchu (TW);
Ruey-Hsin Liu, Hsin-Chu (TW);
Ming-Ta Lei, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/382,455

(22) Filed: Apr. 12, 2019

(65) Prior Publication Data
US 2019/0237485 A1     Aug. 1, 2019

Related U.S. Application Data

(62) Division of application No. 14/453,304, filed on Aug. 6, 2014, now Pat. No. 10,276,596.

(51) Int. Cl.
*H01L 27/12* (2006.01)
*H01L 29/49* (2006.01)
(Continued)

(52) U.S. Cl.
CPC ...... *H01L 27/124* (2013.01); *H01L 21/28105* (2013.01); *H01L 29/4983* (2013.01); *H01L 29/6659* (2013.01); *H01L 29/7833* (2013.01)

(58) Field of Classification Search
CPC ........... H01L 27/14689; H01L 29/6659; H01L 29/7833
See application file for complete search history.

(56) References Cited

U.S. PATENT DOCUMENTS 6,187,657 B1   2/2001   Xiang et al.
6,348,389 B1   2/2002   Chou et al.
(Continued)

OTHER PUBLICATIONS

Yang-Kyu Chou, et al.; "Investigation of Gate-Induced Drain Leakage (GIDL) Current in Thin Body Devices: Single-Gate Ultra-Thin Body, Symmetrical Double-Gate, and Asymmetrical Double-Gate MOSFETs"; Jpn. J. Appl. Phys. vol. 42 (2003) p. 2073-2076.
(Continued)

*Primary Examiner* — Marc Anthony Armand
(74) *Attorney, Agent, or Firm* — Eschweiler & Potashnik, LLC

(57) ABSTRACT

Some embodiments of the present disclosure relate to a method of forming a transistor. The method includes forming a gate dielectric over a substrate and forming a gate over the gate dielectric. The gate includes polysilicon extending between a first outermost sidewall and a second outermost sidewall of the gate. A mask is formed over the gate. The mask exposes a first gate region extending to the first outermost sidewall and covers a second gate region extending between the first gate region and the second outermost sidewall. Dopants are selectively implanted into the first gate region according to the mask. Source and drain regions are formed within the substrate. The source region and the drain region are asymmetric with respect to an interface of the first gate region and the second gate region and extend to substantially equal distances past the first and second outermost sidewalls of the gate, respectively.

20 Claims, 10 Drawing Sheets

(51) Int. Cl.
*H01L 29/66* (2006.01)
*H01L 29/78* (2006.01)
*H01L 21/28* (2006.01)

(56) References Cited

U.S. PATENT DOCUMENTS

| | | | |
|---|---|---|---|
| 6,744,101 B2 * | 6/2004 | Long | H01L 21/28105 257/324 |
| 7,605,830 B2 | 10/2009 | Date | |
| 8,513,712 B2 | 8/2013 | Chu et al. | |
| 2002/0109153 A1 * | 8/2002 | Ker | H01L 27/0251 257/199 |
| 2002/0117714 A1 | 8/2002 | Hebert | |
| 2007/0247409 A1 | 10/2007 | Nishimura et al. | |
| 2010/0230748 A1 | 9/2010 | Hikida | |
| 2012/0044737 A1 | 2/2012 | Chung | |
| 2012/0161230 A1 | 6/2012 | Satoh et al. | |
| 2012/0161233 A1 | 6/2012 | Ito | |
| 2013/0021839 A1 | 1/2013 | Ishikura et al. | |
| 2013/0082320 A1 | 4/2013 | Alberhasky et al. | |
| 2013/0171791 A1 | 7/2013 | Shima et al. | |
| 2013/0181286 A1 | 7/2013 | Zhang | |
| 2014/0027817 A1 | 1/2014 | Trivedi | |
| 2015/0093864 A1 | 4/2015 | Perera | |
| 2015/0303254 A1 | 10/2015 | Tschumakow et al. | |

OTHER PUBLICATIONS

Farkhanda Ana, et al.; "Suppression of Gate Induced Drain Leakage Current (GIDL) By Gate Workfunction Engineering: Analysis and Model"; Journal of Electron Devices, vol. 13, 2012, p. 984-996.
Non-Final Office Action dated Jan. 18, 2017 for U.S. Appl. No. 14/453,304.
Non-Final Office Action dated May 18, 2017 for U.S. Appl. No. 14/453,304.
Non-Final Office Action dated Nov. 16, 2017 for U.S. Appl. No. 14/453,304.
Final Office Action dated Apr. 11, 2018 for U.S. Appl. No. 14/453,304.
Non-Final Office Action dated Sep. 11, 2018 for U.S. Appl. No. 14/453,304.
Notice of Allowance dated Jan. 9, 2019 for U.S. Appl. No. 14/453,304.

* cited by examiner

SELECTIVE POLYSILICON DOPING FOR GATE INDUCED DRAIN LEAKAGE IMPROVEMENT

REFERENCE TO RELATED APPLICATION

This Application is a Divisional of U.S. application Ser. No. 14/453,304, filed on Aug. 6, 2014, the contents of which are hereby incorporated by reference in their entirety.

BACKGROUND

Flat panel liquid crystal displays (LCDs) are being made increasingly thinner, lighter, and at a lower cost. In addition, a number of color levels in a color LCD has been increased from 260,000 color levels in 6-bit representation to 1,000,000,000 color levels in 10-bit representation. To support such a large number of color levels, an LCD driver circuit is utilized. The LCD driver circuit includes a grayscale voltage generating circuit and an amplification circuit. The grayscale voltage generating circuit generates a grayscale voltage corresponding to a color level of the LCD. The amplification circuit amplifies the grayscale voltage to a detectable level for logic circuits of the LCD.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
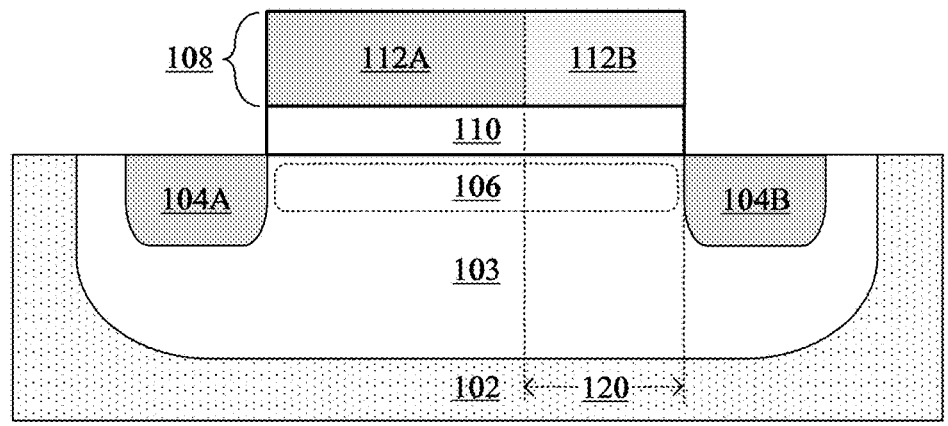
FIGS. 1-2 illustrate cross-sectional views of some embodiments of metal-oxide-semiconductor field-effect transistors (MOSFETs) having a partially undoped or lightly doped gate configured to decrease gate induced drain leakage (GIDL) current.

The following disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the channel length of a metal-oxide-semiconductor field-effect transistor (MOSFET) continues to scale into next-generation technology nodes, suppression of off-state leakage current becomes an increasingly difficult technological challenge. A large component of off-state leakage current is gate induced drain leakage (GIDL) current. GIDL is caused by a large electric field near a drain of the MOSFET. In an off-state of the MOSFET, the drain is connected to a positive voltage and a gate of the MOSFET is connected to a zero or negative voltage. A resultant electric field between the gate and the drain causes a region under the gate near the drain to become depleted. This results in band-to-band tunneling between the drain and the gate, which forms the GIDL current.

Some conventional LCD driver circuits include a differential amplification circuit that utilizes a pair of MOSFETs. The pair of MOSFETs receive a pair of input signals. The pair of input signals include a first input signal corresponding to a color level of the LCD, and a second input signal, which may be ground or a reference voltage. The differential amplification circuit amplifies a voltage difference between the pair of input signals to produce a grayscale voltage corresponding to a color level of the LCD. Robust function of the differential amplification circuit depends upon matching of device characteristics (e.g., GIDL current) between the pair of MOSFETs. A mismatch between the GIDL currents within the pair MOSFETs can result in an incorrect value for the outputted grayscale voltage (i.e., the wrong color level), or no output at all. Therefore, decreasing the GIDL currents within the pair of MOSFETs reduces their device characteristic mismatch.

FIG. 1 illustrates some embodiments of a MOSFET 100 configured to decrease GIDL current.

The MOSFET 100 comprises a source region 104A and a drain region 104B arranged within a semiconductor substrate 102. In some embodiments, the source region 104A and the drain region 104B may be located within a well 103. The source and drain regions 104A, 104B are laterally separated by a channel region 106. The MOSFET 100 further comprises a gate 108 separated from the channel region 106 by a gate dielectric 110. In some embodiments, the gate 108 is arranged over the channel region 106 (e.g., in a planar FET). In some embodiments, the gate 108 surrounds the channel region 106 (e.g., in non-planar device, such as a FINFET).

The gate 108 comprises a first gate region 112A, which is adjacent the source region 104A. The gate 108 further comprises a second gate region 112B, which is adjacent the drain region 104B. The gate 108 is selectively doped so that the first gate region 112A has a larger concentration of dopants than the second gate region 112B (e.g., by at least one order of magnitude). In some embodiments, the second gate region 112B is lightly-doped. In some embodiments, the second gate region 112B is undoped (i.e., having an intrinsic carrier concentration, but substantially zero impurities that are implanted or diffused into the second gate region 112B through a doping process).

The lower dopant concentration of the second gate region 112B reduces the electric field in a region 120 beneath the gate 108 adjacent the drain region 104B. The reduced electric field in region 120 causes the GIDL current of MOSFET 100 to be reduced relative to a MOSFET having a uniformly doped gate.

Figure 2:
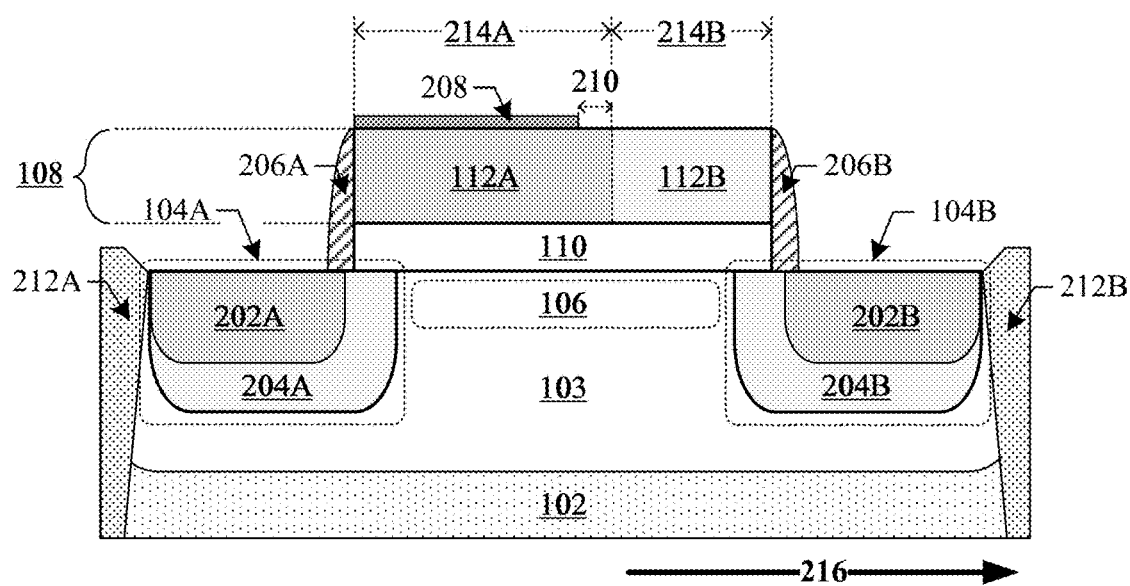

FIG. 2 illustrates a cross-sectional view of some embodiments of a high $V_t$ MOSFET 200.

The high $V_t$ MOSFET 200 is a double-diffused drain (DDD) MOSFET, with source and drain regions 104A, 104B that comprise shallow doped regions 202A, 202B arranged within deeper doped regions 204A, 204B. The deeper doped regions 204A, 204B have a first conductivity type (e.g., n-type) that is opposite that of the well 103 (e.g., p-type). The shallow doped regions 202A, 202B also have the first conductivity type that is opposite that of the well 103 (i.e., the same as the deeper doped region 204A, 204B). However, a dopant concentration of the deeper doped regions 204A, 204B (e.g., n−) is less than a dopant concentration of the shallow doped regions 202A, 202B (e.g., n+). The deeper doped region 204A of the source region 104A extends partially beneath the first gate region 112A. Likewise, the deeper doped region 204B of the drain region 104B extends beneath the second gate region 112B.

The double-diffused drain (DDD) MOSFET mitigates hot carrier effects, thereby decreasing a signal-to-noise (S/N) ratio for the generated grayscale voltages compared to the MOSFET 100. This is because the deeper doped regions 204A, 204B trap a majority of the electric field from the gate 108, and consequently reduce the hot carrier effects within the channel region 106. This increases the S/N ratio of the high Vt MOSFET 200 relative to the MOSFET 100.

First and second sidewall spacers 206A, 206B are arranged on opposite sidewalls of the gate 108. In some embodiments, the first and second sidewall spacers 206A, 206B may comprise silicon-nitride or silicon oxide, for example. A silicide layer 208 is arranged on the first gate region 112A. A "setback region" 210 of the first gate region 112A extends laterally past the silicide layer 208, which further reduces the voltage drop between the gate 108 and the drain region 104B. First and second shallow trench isolations (STIs) 212A, 212B are disposed on either side of the high $V_t$ MOSFET 200 for electrical isolation. In some embodiments, the high $V_t$ MOSFET 200 is disposed on a silicon-on-insulator (SOI) substrate comprising a layer of buried oxide (BOX) for further electrical isolation.

The first gate region 112A has a first length 214A that is greater than a second length 214B of the second gate region 112B, as measured along a channel length direction 216. The first gate region 112A is arranged over a majority of the channel region 106 on a source side of the gate 108. The second gate region 112B occupies a portion of the channel region 106 to reduce the electric field between the gate 108 and drain region 104, which consequently reduces the GIDL current.

Figure 3:
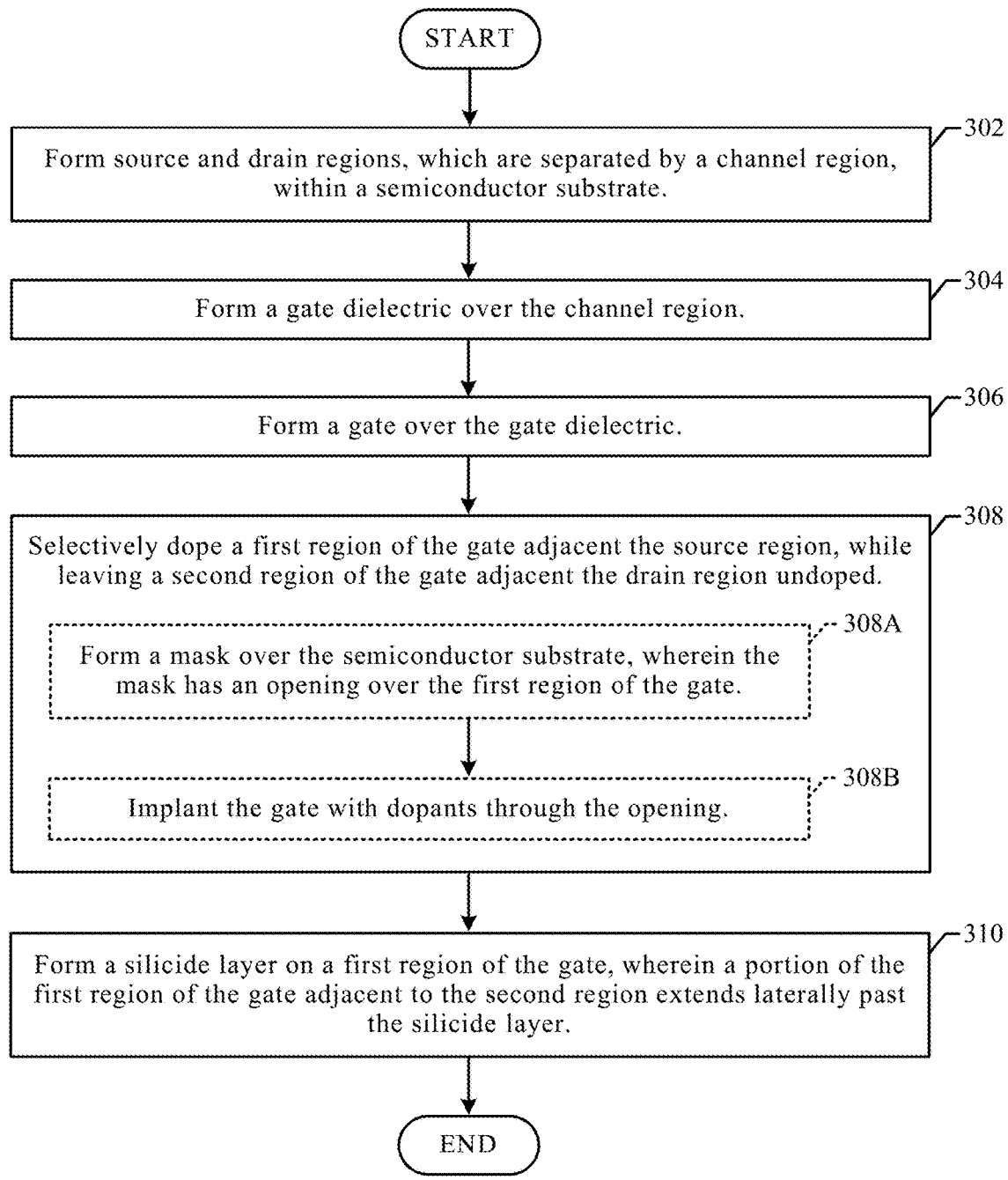
FIG. 3 illustrates some embodiments of a method to form a MOSFET in accordance with some embodiments.

FIG. 3 illustrates some embodiments of a method 300 to form a MOSFET in accordance with some embodiments.

At 302, source and drain regions are formed within a semiconductor substrate. The source and drain regions are separated by a channel region 106. In some embodiments, the semiconductor substrate comprises a p-type substrate, which is implanted or diffused with dopants such as nitrogen (N), phosphorous (P), arsenic (As), antimony (Sb), or bismuth (Bi), and the like, to form n-type source and drain regions.

At 304, a gate dielectric is formed over a channel region of the semiconductor substrate, at a position laterally arranged between the source and drain regions (i.e., over the channel region).

At 306, a gate is formed over the gate dielectric. In some embodiments, formation of the gate dielectric in 304 and the gate in 306 comprises disposal of a dielectric layer (e.g., $SiO_2$) over an upper surface of the substrate, and disposal of a gate layer (e.g., polysilicon) over the dielectric layer. The dielectric layer and the gate layer are then patterned and etched to form the gate dielectric and gate, respectively.

At 308, a first region of the gate adjacent to the source region is selectively doped, while a second region of the gate adjacent the drain region remains undoped. In some embodiments, doping of the first region of the gate comprises arranging a mask over the semiconductor substrate in 308A, wherein the mask has an opening over the first region of the gate. In 308B, the gate is then implanted with the dopants (e.g., N, P, As, etc.) through the opening. In some embodiments, the mask also has openings over the source and drain regions. As a result, the source and drain regions are also selectively doped with the dopants at the same time as the gate.

At 310, a silicide layer is formed on the first region of the gate. In some embodiments, a portion of the first region of the gate adjacent to the second region extends laterally past the silicide layer. In some embodiments, formation of the silicide layer comprises a self-aligned silicide (or salicide) process, wherein a thin transition metal layer is formed over the gate. The semiconductor substrate is then annealed, which causes the transition metal to react with exposed silicon of the gate to form a low-resistance transition metal silicide.

FIGS. 4A-4M illustrate a series of cross-sectional views that depict formation the high $V_t$ MOSFET 200. Although FIGS. 4A-4M are described in relation to the method 300, it will be appreciated that the structures disclosed in FIGS. 4A-4M are not limited to the method 300, but instead may stand alone as structures independent of the method 300. Similarly, although the method 300 is described in relation to FIGS. 4A-4M, it will be appreciated that the method 300 is not limited to the structures disclosed in FIGS. 4A-4M, but instead may stand alone independent of the structures disclosed in FIGS. 4A-4M.

Figure 4A:
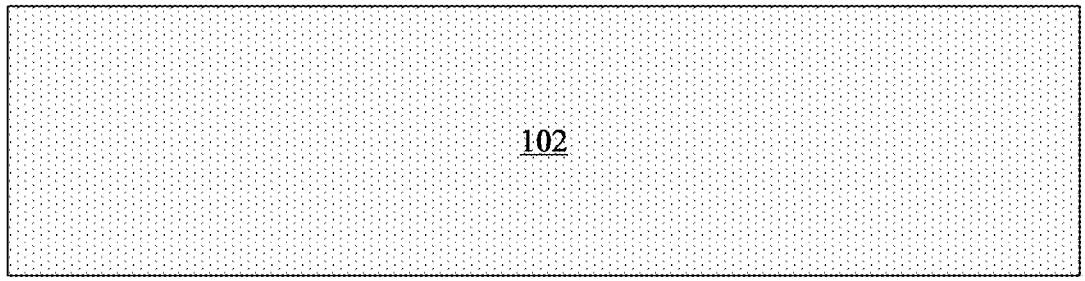
FIGS. 4A-4M illustrate a series of cross-sectional views that depict formation a MOSFET in accordance with some embodiments.

In FIG. 4A, a semiconductor substrate 102 is provided. In some embodiments, the semiconductor substrate 102 may comprise a p-type substrate. In other embodiments, the semiconductor substrate 102 comprises an n-type substrate.

Figure 4B:
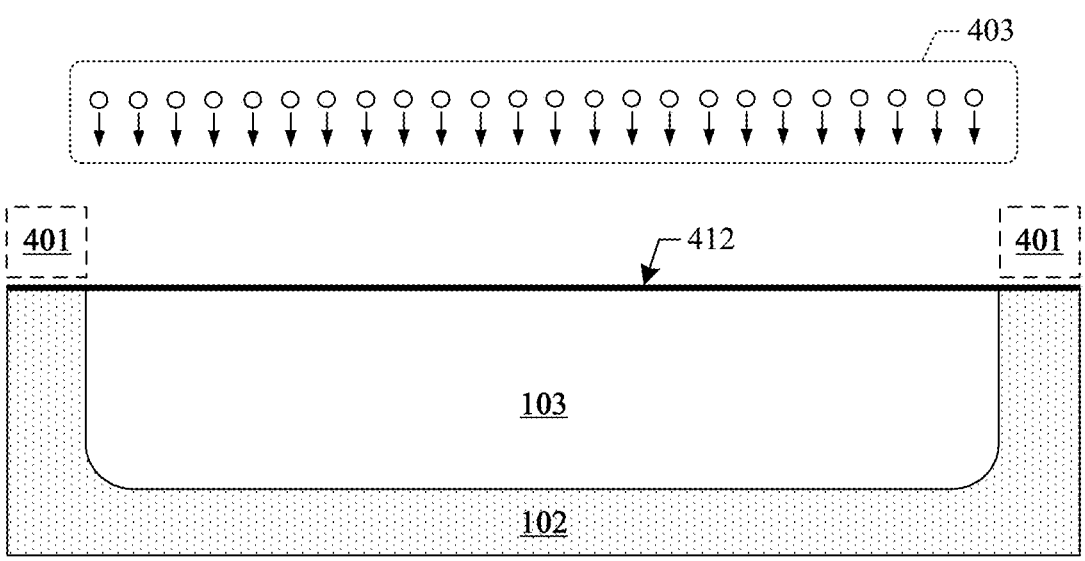

In FIG. 4B, a well 103 is formed within the semiconductor substrate 102 by patterning a mask layer 401 (e.g., an oxide or nitride layer) over an upper surface 412 of the semiconductor substrate 102. Dopants 403 are then implanted into the semiconductor substrate 102 through the mask layer 401 with an ion implant. The ion implant is followed by an anneal of the semiconductor substrate 102 to drive-in and activate the dopants, and to repair damage caused by the ion implant. In some embodiments, the well 103 is p-type, consisting of acceptors such boron (B), aluminum (Al), gallium (Ga), indium (In), etc. In other embodiments, the well 103 is n-type.

Figure 4C:
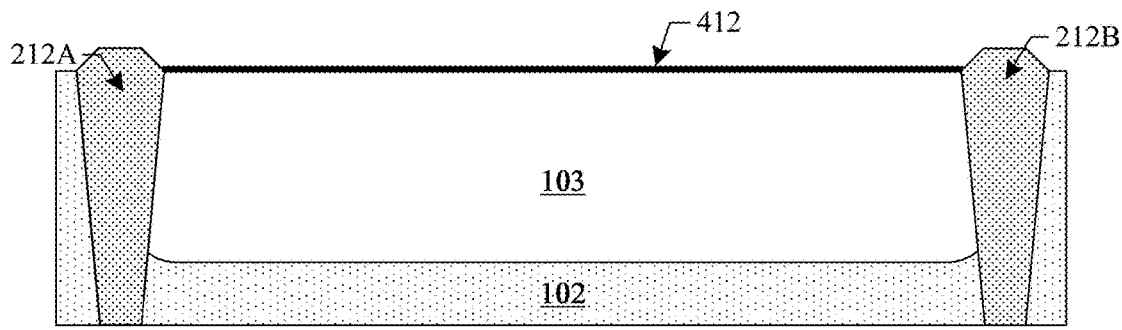

In FIG. 4C, first and second STIs 212A, 212B are formed laterally on either side of the well 103. Formation of the first and second STIs 212A, 212B includes an etch of the semiconductor substrate 102 through the upper surface 412 of the semiconductor substrate 102 to form first and second trenches, which are then filled with oxide (e.g., $SiO_2$)

through chemical vapor deposition (CVD), or other appropriate deposition process, to form the first and second STIs 212A, 212B.

Figure 4D:
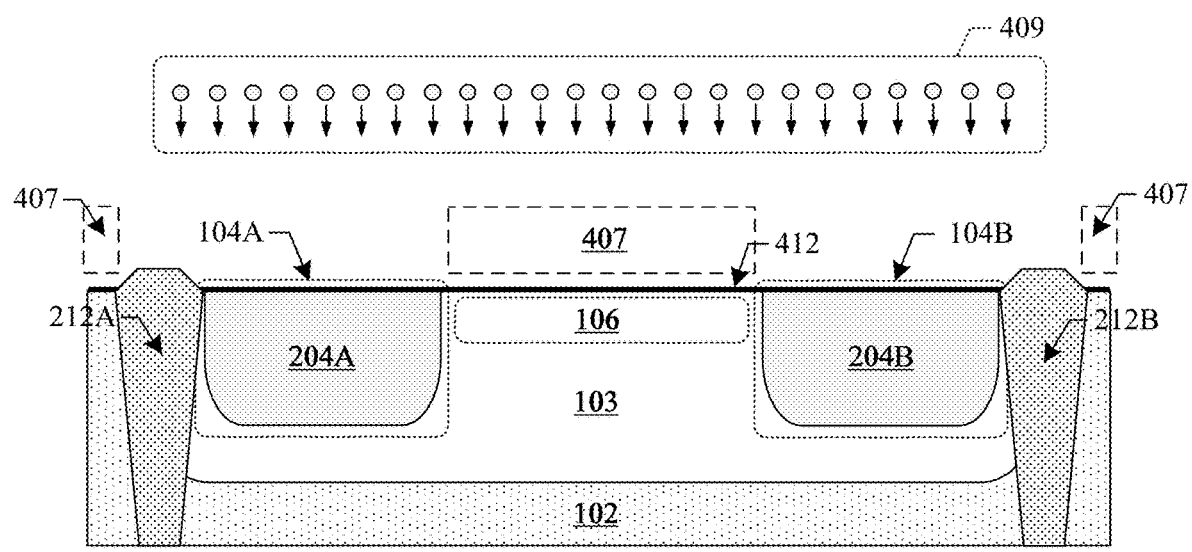

In FIG. 4D, source and drain regions 104A, 104B are formed within the well 103. The source and drain regions 104A, 104B comprise deeper doped regions 204A, 204B, which are formed through patterning a mask 407 to expose the source and drain regions 104A, 104B, implantation of one or more dopants 409 (e.g., N, P, As, etc.), diffusion, or a combination of the two. In some embodiments, the deeper doped regions 204A, 204B may comprise an n-type doping. The deeper doped regions 204A, 204B are configured to reduce an electric field gradient between the source and drain regions 104A, 104B and the channel region 106 to mitigate hot carrier effects.

Figure 4E:
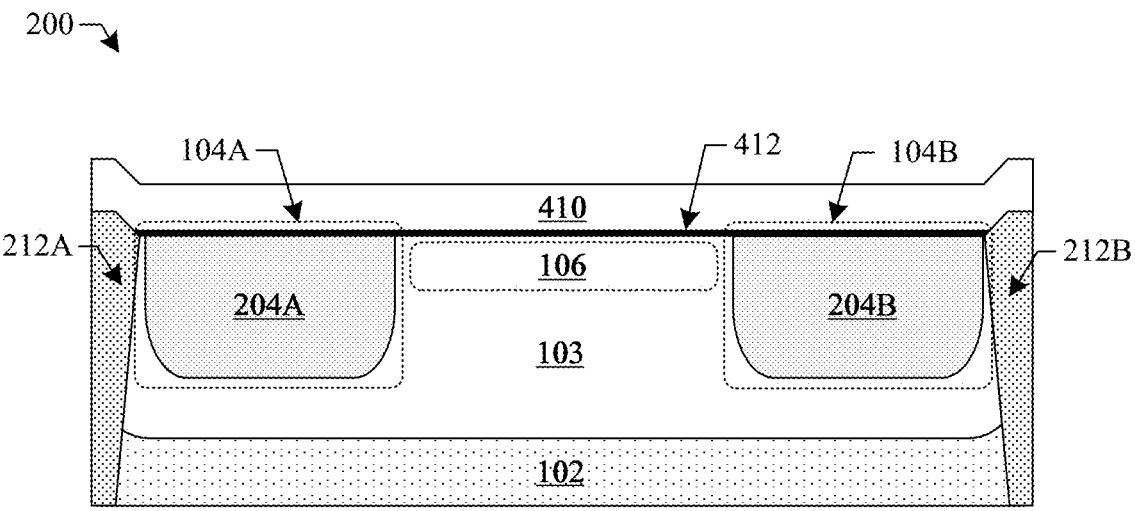

In FIG. 4E, a dielectric layer 410 is formed over the upper surface 412 of the semiconductor substrate 102. In various embodiments, the dielectric layer 410 may comprise silicon oxide ($SiO_2$) or a high-k dielectric layer. In some embodiments, disposal of the dielectric layer 410 includes a wet or dry oxidation, physical vapor deposition (PVD), CVD, atomic layer deposition (ALD), molecular beam epitaxy (MBE), electron beam (e-beam) epitaxy, or other appropriate process.

Figure 4F:
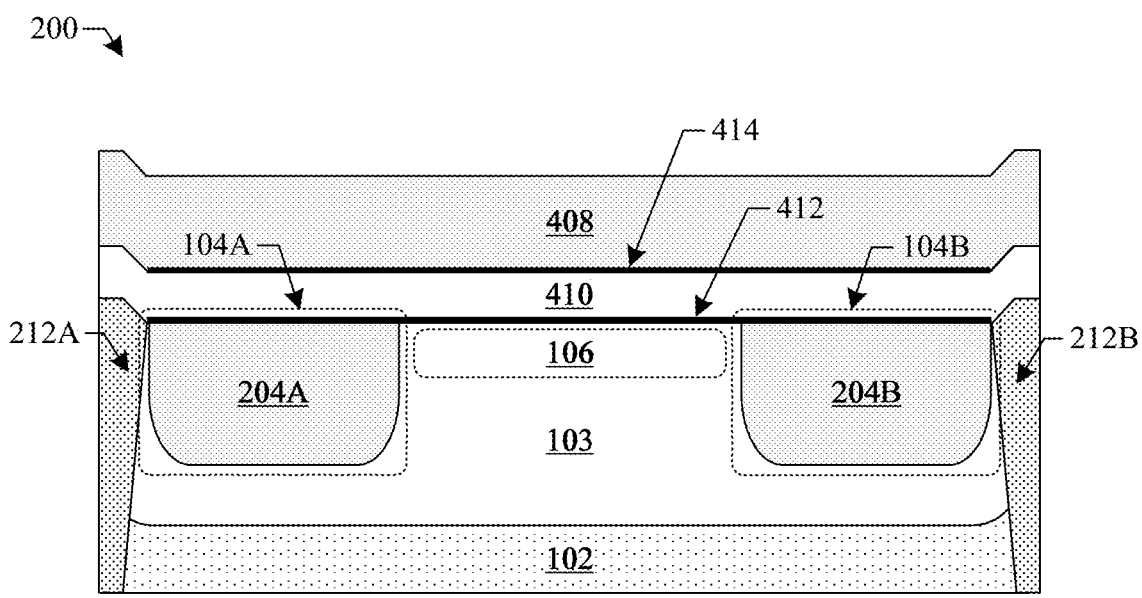

In FIG. 4F, a gate layer 408 is formed on an upper surface 414 of the dielectric layer 410. In various embodiments, the gate layer 408 may comprise polysilicon, for example. In various embodiments, the gate layer 408 is formed by PVD, CVD, ALD, MBE, e-beam epitaxy, or other appropriate deposition process.

Figure 4G:
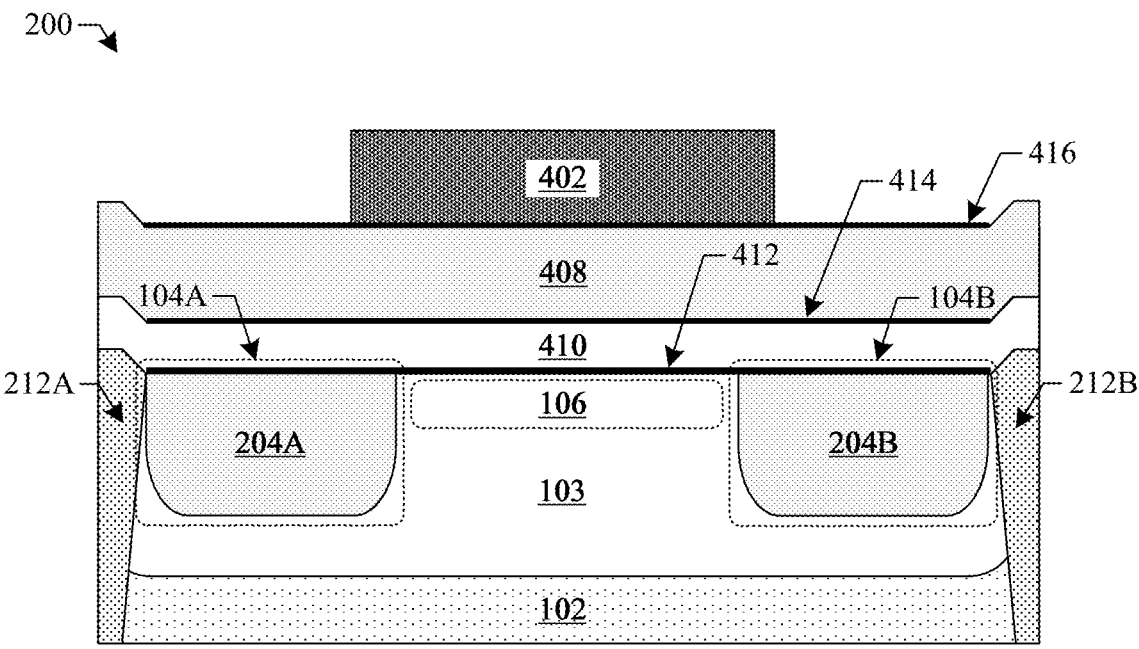

In FIG. 4G, a first mask 402 (e.g., SiN) is patterned over an upper surface 416 of the gate layer 408 using one or more photolithographic techniques. A photoresist layer (not shown) is typically spin-coated over the upper surface 416 of the gate layer 408, exposed to radiation (e.g., light), and developed to form a pattern corresponding to the first mask 402. The photoresist layer is then removed using conventional techniques, such as stripping, ashing, or the like.

Figure 4H:
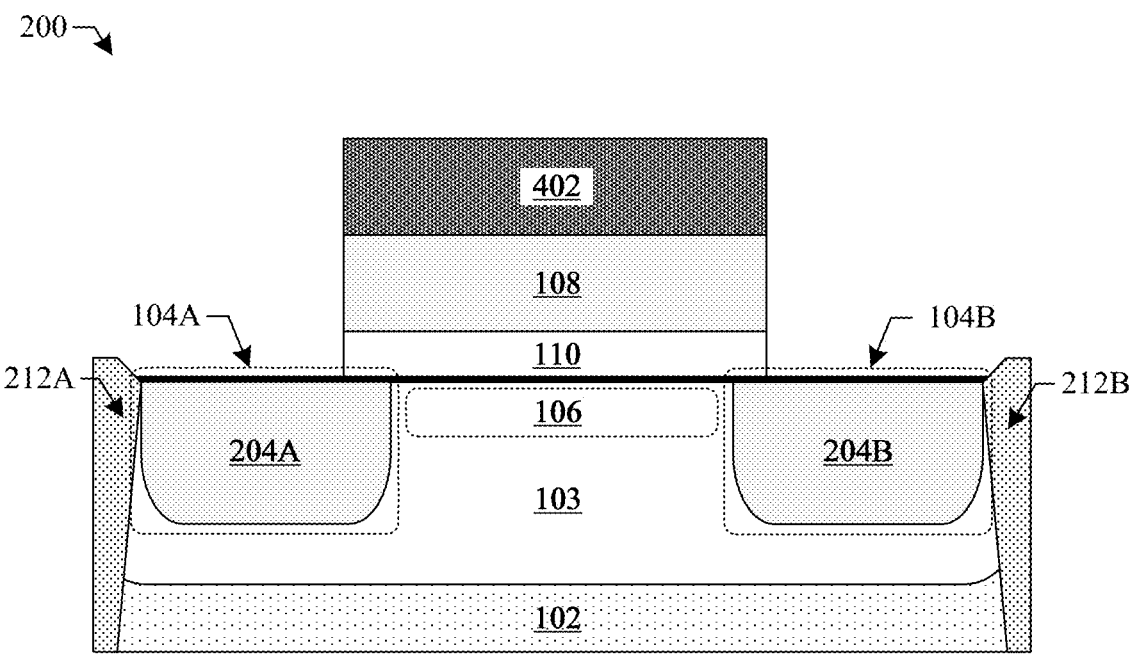

In FIG. 4H, the exposed portions of the gate layer 408 and the dielectric layer 410 are removed using a first etch with the first mask 402 in place over the upper surface 416 of the gate layer 408, to form the gate 108 and gate dielectric 110. In some embodiments the first etch comprises a dry etch (e.g., a plasma etch with tetrafluoromethane ($CF_4$), sulfur hexafluoride ($SF_6$), nitrogen trifluoride ($NF_3$), etc.). In some embodiments, the first etch comprises a wet etch (e.g., using one or more wet etchants such as hydrofluoric acid (HF), potassium hydroxide (KOH), tetramethylammonium hydroxide (TMAH), etc.).

Figure 4I:
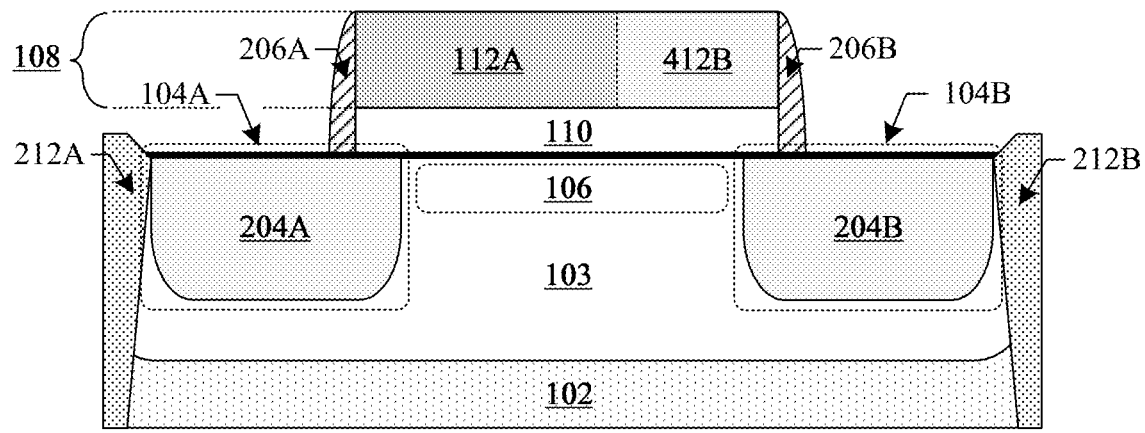

In FIG. 4I, the first mask 402 is removed. In some embodiments, removal of the first mask 402 comprises a selective etch with an etch selectivity between the first mask 402 (e.g., SiN) and the gate 108 (e.g., polysilicon), such that it etches the first mask 402, while leaving the gate 108 substantially intact. First and second sidewall spacers 206A, 206B have then been formed to prevent subsequent implants from penetrating too close to the channel region 106. Formation of the first and second sidewall spacers 206A, 206B includes disposal of a conformal spacer layer (e.g., $SiO_2$), which is then etched back by an etch process (e.g., a plasma etch), leaving portions of the spacer layer on sidewalls of the gate 108 and gate dielectric 110.

Figure 4J:
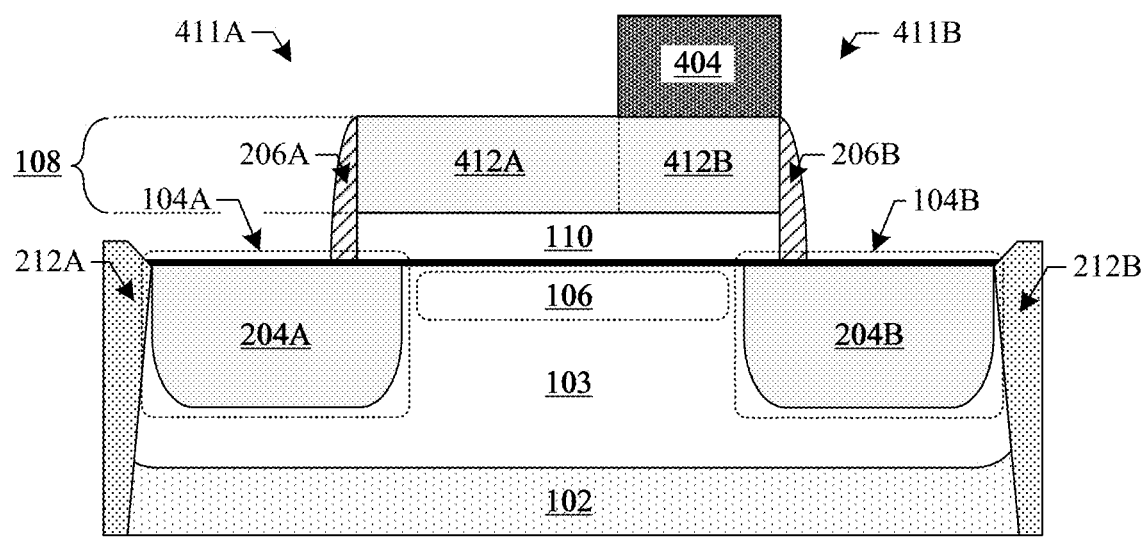

In FIG. 4J, a second mask 404 is formed over the gate 108. The second mask 404 is patterned to form a first opening 411A over a first region 412A of the gate 108 and the source region 104A, and a second opening 411B over the drain region 104B. In some embodiments, the second mask 404 comprises a conformal layer of oxide (e.g., SiO2) or nitride (e.g., SiN), which has been deposited and patterned through photolithography.

Figure 4K:
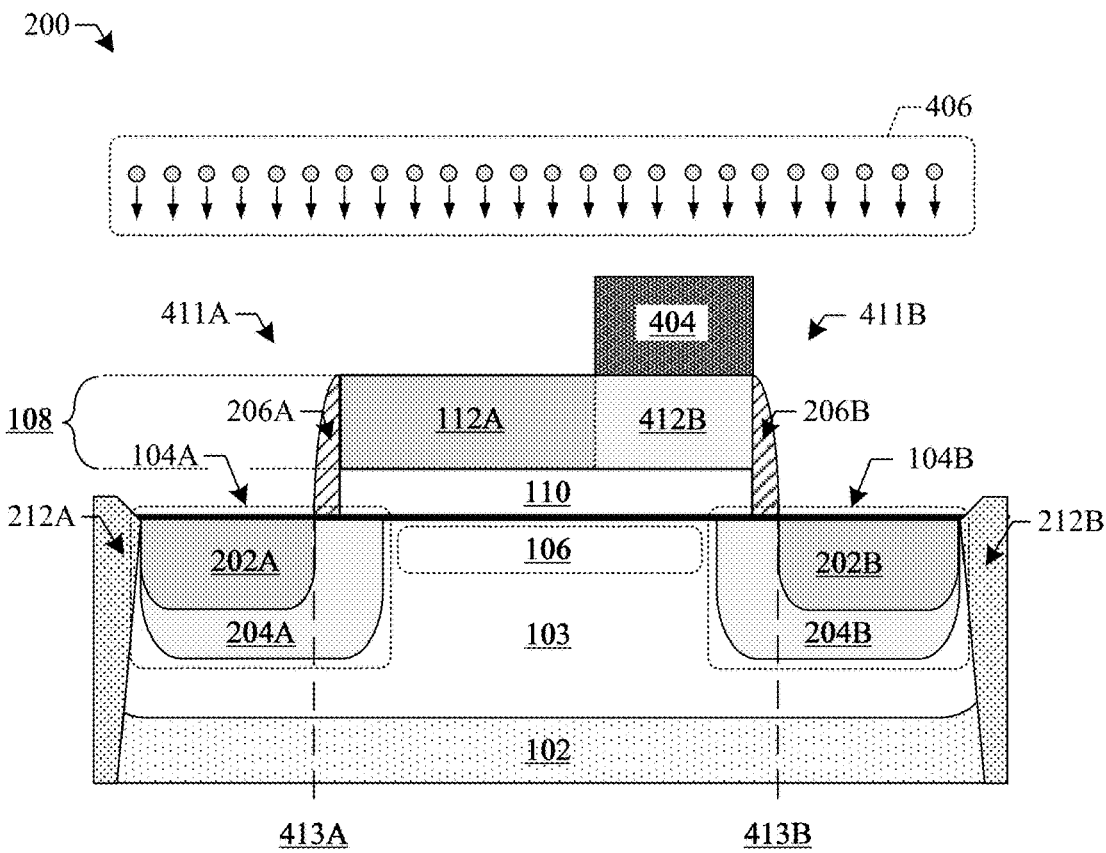

In FIG. 4K, the gate 108 is implanted with one or more dopants 406 (e.g., N, P, As, etc.) through the first opening 411A with an ion implantation technique, to form a first gate region 112A, while leaving an undoped region 412B of the gate 108 beneath the second mask 404. In some embodiments, a focus, dose, or energy of the one or more dopants 406 are independently varied to achieve a gradient concentration, or a substantially uniform concentration, of dopants 406 within the gate 108.

The dopants 406 also form shallow doped regions 202A, 202B within the deeper doped regions 204A, 204B, through the first and second openings 411A, 411B. In some embodiments, first and second borders 413A, 413B between the shallow doped regions 202A, 202B and the deeper doped regions 204A, 204B are self-aligned with edges of the first and second sidewall spacers 206A, 206B immediately after implantation. The deeper doped regions 204A, 204B and the shallow doped regions 202A, 202B both have a same conductivity type (e.g., n-type conductivity). However, a concentration of dopants within the shallow doped regions 202A, 202B is significantly greater than a concentration of dopants within the deeper doped regions 204A, 204B (i.e., one or more orders of magnitude). Consequently, an electric field gradient between the source and drain regions 104A, 104B and the channel region 106 is reduced, which mitigates hot carrier effects.

In some embodiments, after exposure to the ionized beam through the second mask 404, the semiconductor substrate 102 is aligned with a third mask (not shown). The third mask has an opposite polarity of the second mask 404, such that the first region 412A of the gate 108 is covered, and the undoped region 412B is uncovered. The gate 108 is then implanted with one or more second dopants to form the second gate region 112B.

Figure 4L:
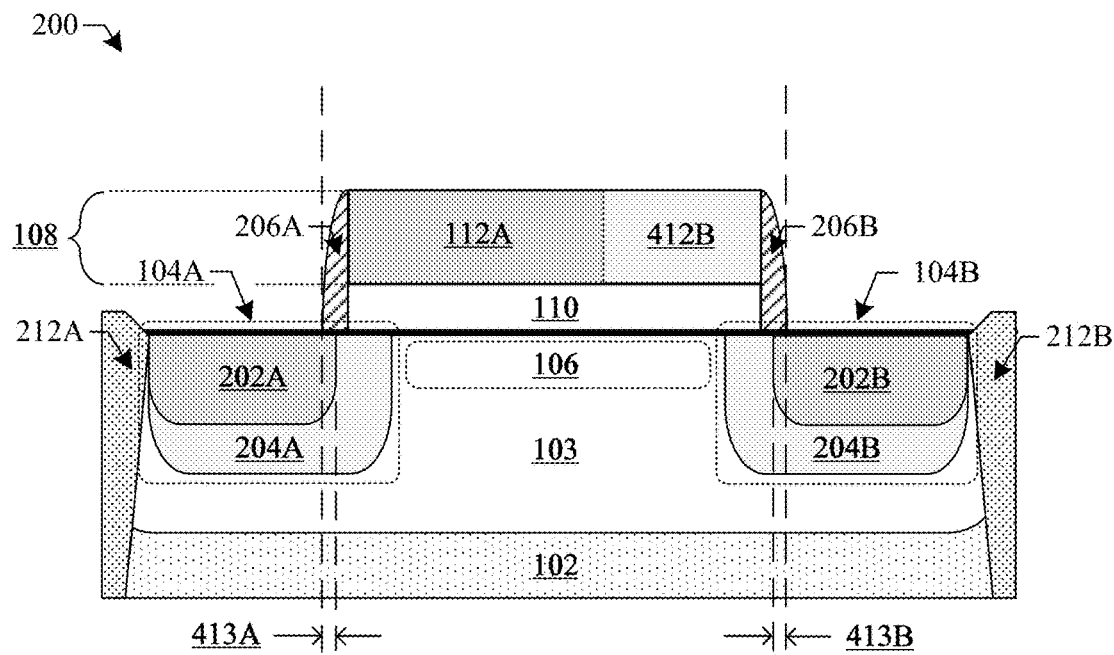

In FIG. 4L, the second mask is removed (e.g., though a selective etch), and an anneal is performed to drive-in and activate the dopants 406, and to repair damage caused by the ion implant. The anneal results in lateral diffusion of first and second borders 413A, 413B from a position self-aligned to an edge of the first and second sidewall spacers 206A, 206B, to a position underneath the first and second sidewall spacers 206A, 206B. In some embodiments, anneal conditions result in diffusion of the border 411 to underneath the gate dielectric 110.

Figure 4M:
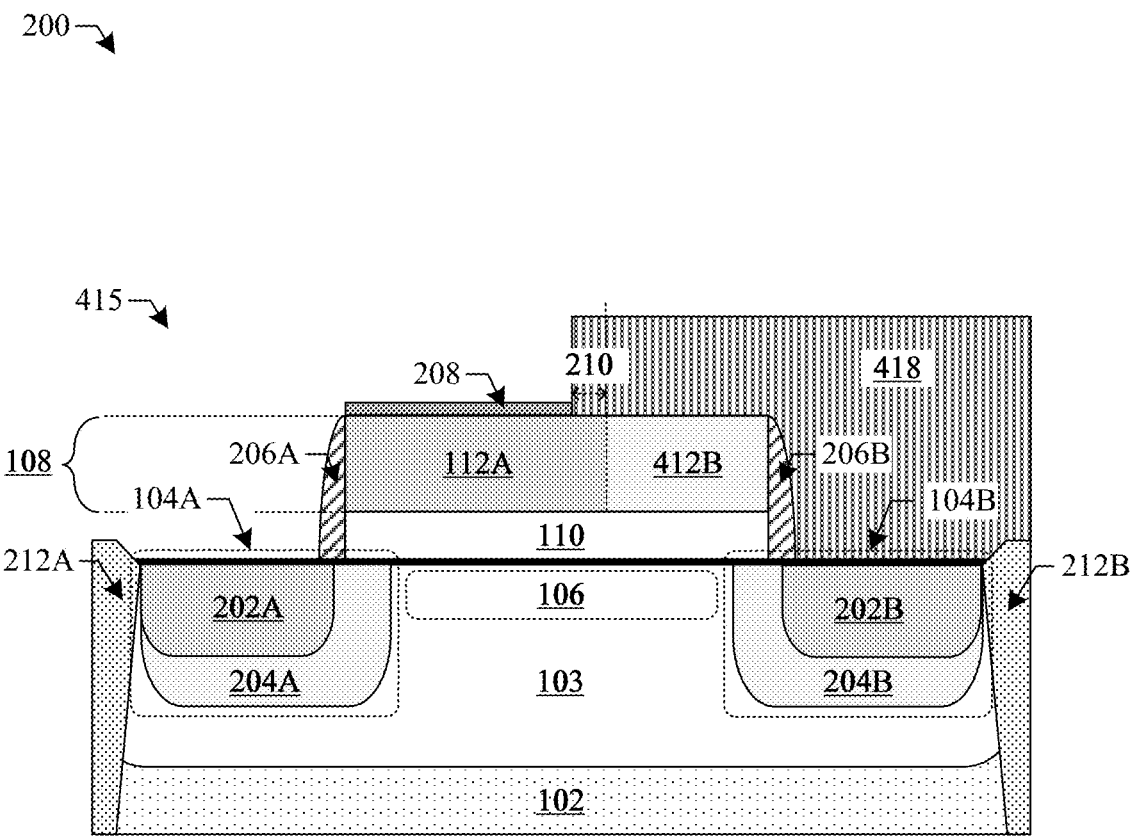

In FIG. 4M, a resist protective oxide (RPO) mask 418 is formed over the undoped region 412B of the gate 108 adjacent the drain region 104B, and over a portion of the first gate region 112A immediately adjacent the undoped region 412B (which forms the setback region 210). The RPO mask 418 is a salicide blocking layer configured to block silicide formation beneath it. The RPO mask also blocks silicide formation on the undoped region 412B, and over the setback region 210.

In some embodiments, formation of the RPO mask 418 includes deposition of a conformal layer of nitride (e.g., SiN) or oxynitride (e.g., SiON), coating the layer of nitride or oxynitride with photoresist, and patterning of the photoresist to define a salicide region 415, which has then been etched through the nitride or oxynitride to form the RPO mask 418. Upon formation of the RPO mask 418, a transition metal (e.g., Ti) is deposited on an upper surface of the gate 108. A series of reactions are been initiated, through implantation of reactive agents, and one or more anneals, etc. The reactions occur between the transition metal and exposed silicon of an upper surface of the gate 108, and form a silicide layer 208 (e.g., titanium disilicide (TiSi$_2$)). The silicide layer 208 comprises silicon and one or more electropositive elements (i.e., having an ability to donate electrons, e.g., Ti). The silicide layer 208 reduces contact resistance when a contact is formed to the gate 108. Upon removal of the RPO mask 418 (e.g., through a selective etch step), the high V$_t$ MOSFET 200 of FIG. 2 has been formed.

Figure 5:
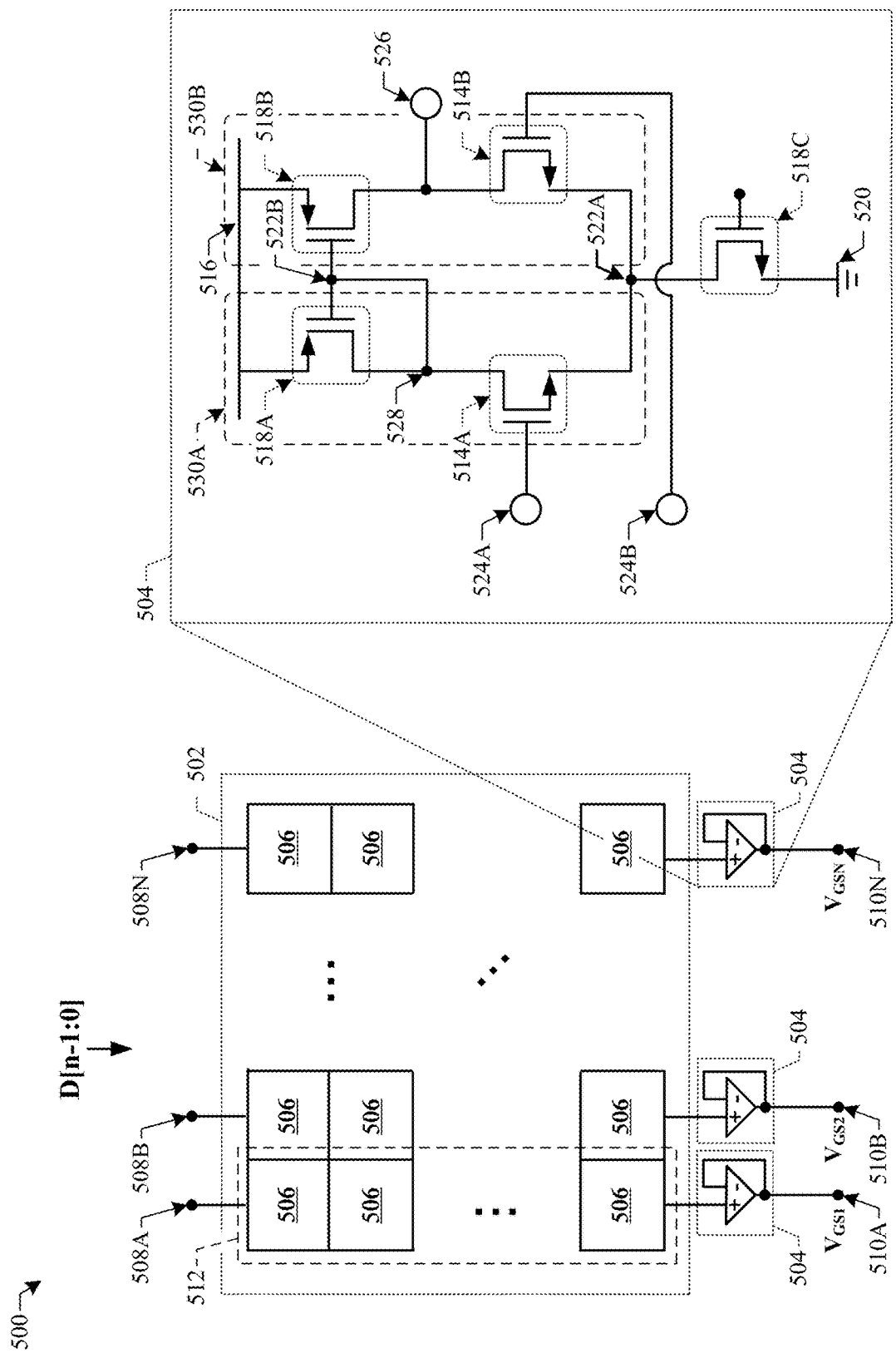
FIG. 5 illustrates come embodiments of a driver circuit having a differential amplifier with one or more disclosed MOSFET transistors.

FIG. 5 illustrates some embodiments of a driver circuit 500 for an LCD.

The driver circuit 500 comprises a digital-to-analog converter (DAC) 502 and a plurality of differential amplifiers 504. The driver circuit 500 is configured to generate N grayscale voltages V$_{GS1}$-V$_{GSN}$ on output pins 510A-510N corresponding to an n-bit data input D[n-1:0] to input pins 508A-508N. In some embodiments, the n-bit data input D[n-1:0] is introduced into the driver circuit 600 from a latch, level shifter, or other device (not shown). The generated grayscale voltages V$_{GS1}$-V$_{GSN}$ are the applied to liquid crystal elements (not shown) of the LCD via the plurality of differential amplifiers 504. In some embodiments, the DAC 502 is a thermally encoded current DAC, wherein current sources within individual unit cells 506 are summed to generate analog grayscale voltages V$_{GS1}$-V$_{GSN}$. In some embodiments, the DAC 502 forms N data paths along N columns of unit cells 506 (e.g., column 512), which includes a differential amplifier 504. In other embodiments, data paths may be formed from rows, or can be shared (e.g., multiplexed) between multiple columns and/or rows of unit cells 506.

The differential amplifiers 504 respectively have first and second transistors 514A, 514B, which are arranged in parallel. In various embodiments, the first and second transistors 514A, 514B both comprise MOSFETs 100 or high V$_t$ MOSFETs 200. A first drain of the first transistor 514A and a second drain of the second transistor 514B are connected to a power source 516 through first and second access transistors 518A, 518B, respectively. Likewise, a first source of the first transistor 514A and a second source of the second transistor 514B are connected to ground 520 through a third access transistor 518C, which is connected to a first common node 522A that couples the first and second sources. In some embodiments, the third access transistor 518C acts as a constant current source between the first common node 522A and ground 520.

A first gate of the first transistor 514A and a second gate of the second transistor 514B are connected to a differential input received at first and second input pins 524A, 524B. A source of the second access transistor 518B is connected to an output pin 526 of the differential amplifier 504. Gates of the first and second access transistors 518A, 518B are connected to a source 528 of the first access transistor 518A through a second common node 5522B, which forms a current mirror that increases a gain of the differential amplifier 504.

The differential amplifier 504 amplifies the difference (ΔV) between a differential input voltage applied to the first and second input pins 524A, 524B. The differential input voltage comprises a high voltage (V$_{high}$) and a low voltage (V$_{low}$), wherein ΔV=V$_{high}$-V$_{low}$. Ideally, if an identical input voltage is applied to the first and second input pins 524A, 524B (i.e., if V$_{high}$=V$_{low}$), an output voltage at the output pin 526 should be zero. However, variation in device characteristics between corresponding devices within first and second transistor chains 530A, 530B of the differential amplifier 504 (particularly the first and second transistors 514A, 514B), can result in an incorrect output to the output pin 526.

Differences in GIDL current between the first and second transistors 514A, 514B can increases a relative mismatch between the pull-down characteristics of the first and second transistors 514A, 514B. To mitigate against GIDL current, the gates of the first and second transistors 514A, 514B are selectively doped. Consequently, they each comprise matching geometries comprising a doped region adjacent the source, and an undoped (or lightly doped) region adjacent the drain. This reduces a gate-to-drain electric field, and resultant GIDL current, within the first and second transistors 514A, 514B.

Therefore, some embodiments of the present disclosure relate to a MOSFET configured to decrease the GIDL current. The MOSFET comprises source and drain regions, which are separated by a channel region. A gate is arranged over the channel region. The gate is selectively doped adjacent the source region, while a region adjacent the drain region left undoped or lightly-doped. The undoped or lightly-doped region of the gate reduces the electric field between the gate and the drain, and hence reduces the GIDL current. In some embodiments, the undoped or lightly-doped region of the gate can reduce the off-state leakage of the MOSFET by about three orders of magnitude.

Some embodiments relate to a transistor, comprising a source region and a drain region, which are separated by a channel region. A gate is separated from the channel region by a gate dielectric. The gate comprises a first gate region having a first dopant concentration, which is adjacent the source region. The gate further comprises a second gate region having a second dopant concentration, which is adjacent the drain region, wherein the second dopant concentration is less than the first dopant concentration.

Other embodiments relate to a circuit, comprising a first transistor, comprising a first source region and a first drain region each having a first conductivity type, which are disposed within a semiconductor substrate having a second conductivity type between the first source region and first drain region. A first gate is arranged over the semiconductor substrate at a position laterally between the first source region and the first drain region. The first gate comprises a doped gate region abutting a first sidewall of the gate region adjacent the first source region, and an undoped gate region abutting a second sidewall of the gate region adjacent the first drain region, which opposes the first sidewall. The circuit further comprises a second transistor arranged in parallel with the first transistor. The first source of the first transistor and a second source of the second transistor are connected to ground through a first common node. The first drain of the first transistor and a second drain of the second transistor are connected to a power source. The first gate of the first transistor and a second gate of the second transistor are connected to a differential input comprising first and second input voltages.

Still other embodiments relate to a method of forming a transistor. The method comprises forming a source region and a drain region within a semiconductor substrate. The method further comprises forming a gate dielectric over a channel region of the semiconductor substrate, at a position laterally arranged between the source region and the drain region. The method also comprises forming a gate over the gate dielectric, and selectively doping a first region of the gate adjacent the source region, while leaving a second region of the gate adjacent the drain region undoped.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a transistor, comprising:
   forming a gate dielectric over a substrate;
   forming a gate over the gate dielectric, wherein the gate comprises polysilicon extending between a first outermost sidewall and a second outermost sidewall of the gate;
   forming a mask over the gate, wherein the mask exposes a first gate region extending to the first outermost sidewall and covers a second gate region extending between the first gate region and the second outermost sidewall;
   selectively implanting dopants into the first gate region according to the mask; and
   forming a source region and a drain region within the substrate, wherein the source region and the drain region are asymmetric with respect to an interface of the first gate region and the second gate region and extend to substantially equal distances past the first outermost sidewall and the second outermost sidewall, respectively.

2. The method of claim 1, wherein the mask comprises an oxide or a nitride.

3. The method of claim 1, wherein selectively implanting the dopants into the first gate region forms a gradient dopant concentration within the gate.

4. The method of claim 1, wherein the dopants are concurrently implanted into the first gate region and into the substrate to form the source region and the drain region.

5. The method of claim 4, further comprising:
   forming a first sidewall spacer along the first outermost sidewall of the gate and a second sidewall spacer along the second outermost sidewall of the gate, wherein the first sidewall spacer and the second sidewall spacer mask the substrate from being implanted with the dopants.

6. The method of claim 5, further comprising:
   performing an anneal after selectively implanting the dopants into the first gate region, wherein the anneal causes the source region and the drain region to extend to below the first sidewall spacer and the second sidewall spacer.

7. The method of claim 1, further comprising:
   forming one or more sidewall spacers along the first outermost sidewall and along the second outermost sidewall of the gate, wherein the one or more sidewall spacers along the first outermost sidewall of the gate are exposed to the dopants during selectively implanting the dopants into the first gate region.

8. The method of claim 1,
   wherein a channel region extends between the source region and the drain region; and
   wherein the mask has a sidewall that is arranged along a vertical line that bisects the channel region into two parts.

9. A method of forming a transistor, comprising:
   forming a polysilicon gate on a gate dielectric over a substrate;
   forming a mask over part of the polysilicon gate, wherein an upper surface of the polysilicon gate extends past a sidewall of the mask to an outermost sidewall of the polysilicon gate;
   forming a source region and a drain region within the substrate; and
   selectively implanting dopants according to the mask to define a first polysilicon gate region having a first dopant concentration and a second polysilicon gate region having a second dopant concentration less than the first dopant concentration, wherein the source region and the drain region are substantially symmetric about a center of the polysilicon gate and are asymmetric with respect to an interface between the first polysilicon gate region and the second polysilicon gate region.

10. The method of claim 9, wherein the dopants are selectively implanted to concurrently form the first polysilicon gate region, the source region, and the drain region.

11. The method of claim 9, wherein the source region and the drain region are separated by a channel region that is directly below the sidewall of the mask.

12. A method of forming a transistor, comprising:
    forming a polysilicon gate on a gate dielectric formed over a substrate;
    forming a mask over the polysilicon gate, wherein an upper surface of the polysilicon gate extends laterally past a sidewall of the mask to a first outermost sidewall of the polysilicon gate;
    forming a source region and a drain region to substantially equal depths within the substrate; and
    selectively implanting one or more dopants according to the mask to define a first polysilicon gate region having a first dopant concentration and a second polysilicon gate region having a second dopant concentration less than the first dopant concentration.

13. The method of claim 12, further comprising:
    forming a first sidewall spacer along the first outermost sidewall of the polysilicon gate, wherein the first sidewall spacer masks the substrate from being implanted with the one or more dopants.

14. The method of claim 12,
    wherein the source region and the drain region are substantially symmetric about a center of the polysilicon gate and are asymmetric with respect to an interface between the first polysilicon gate region and the second polysilicon gate region; and
    wherein the interface is perpendicular to a line extending between the source region and the drain region.

15. The method of claim 12, wherein the mask comprises an oxide or a nitride.

16. The method of claim 12, wherein the one or more dopants are selectively implanted to form a gradient dopant concentration within the polysilicon gate.

17. The method of claim 12, further comprising:
    forming a first sidewall spacer along the first outermost sidewall of the polysilicon gate and a second sidewall spacer along a second outermost sidewall of the polysilicon gate, wherein the source region has a first edge that is aligned with a sidewall of the first sidewall spacer and the drain region has a second edge that is aligned with a sidewall of the second sidewall spacer.

18. The method of claim 12, further comprising:
implanting the second polysilicon gate region with one or more additional dopants.

19. The method of claim 12, further comprising:
forming a resist protective oxide over the second polysilicon gate region and over a part of the first polysilicon gate region; and
forming a silicide layer on the first polysilicon gate region with the resist protective oxide in place over the second polysilicon gate region.

20. The method of claim 12, further comprising:
forming one or more sidewall spacers along the first outermost sidewall and along a second outermost sidewall of the polysilicon gate, wherein the one or more sidewall spacers along the first outermost sidewall are exposed to the one or more dopants during selectively implanting the one or more dopants into the first polysilicon gate region.

* * * * *